US009103005B2

(12) United States Patent
Tomaru et al.

(10) Patent No.: US 9,103,005 B2
(45) Date of Patent: Aug. 11, 2015

(54) MAGNETIC SHIELDING MATERIAL FOR SUPERCONDUCTING MAGNET

(75) Inventors: Takayuki Tomaru, Tsukuba (JP); Kenichi Sasaki, Tsukuba (JP); Hiroaki Hoshikawa, Niihama (JP); Hiroshi Tabuchi, Niihama (JP)

(73) Assignees: INTER-UNIVERSITY RESEARCH INSTITUTE CORPORATION HIGH ENERGY ACCELERATOR RESEARCH ORGANIZATION, Tsukuba-shi (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 594 days.

(21) Appl. No.: 13/458,301

(22) Filed: Apr. 27, 2012

(65) Prior Publication Data
US 2012/0274327 A1 Nov. 1, 2012

(30) Foreign Application Priority Data

Apr. 28, 2011 (JP) .................................. 2011-101773

(51) Int. Cl.
G01R 33/421 (2006.01)
C22C 21/00 (2006.01)
H01F 1/047 (2006.01)
B23K 35/28 (2006.01)
C22C 45/08 (2006.01)
G01R 33/3815 (2006.01)

(52) U.S. Cl.
CPC .............. *C22C 21/00* (2013.01); *B23K 35/286* (2013.01); *C22C 45/08* (2013.01); *G01R 33/421* (2013.01); *H01F 1/047* (2013.01); *G01R 33/3815* (2013.01)

(58) Field of Classification Search
CPC .......................... G01R 33/421; G01R 33/3815
See application file for complete search history.

(56) References Cited

U.S. PATENT DOCUMENTS

| 5,286,577 A | 2/1994 | Premkumar et al. |
| 5,357,756 A | 10/1994 | Lubell |
| 5,573,861 A * | 11/1996 | Takahashi et al. ............ 428/651 |
| 5,616,191 A * | 4/1997 | Takahashi et al. ............ 148/690 |
| 5,701,744 A | 12/1997 | Eckels et al. |
| 5,733,389 A | 3/1998 | Takahashi et al. |
| 5,774,032 A * | 6/1998 | Herd et al. ..................... 335/216 |
| 5,917,393 A | 6/1999 | Kupiszewski et al. |

(Continued)

FOREIGN PATENT DOCUMENTS

| CN | 1542876 A | 11/2004 |
| EP | 1193505 A2 | 4/2002 |

(Continued)

OTHER PUBLICATIONS

Search Report issued Jul. 31, 2012 in British Patent Application No. 1207372.2.

(Continued)

*Primary Examiner* — Dixomara Vargas
(74) *Attorney, Agent, or Firm* — Sughrue Mion, PLLC

(57) ABSTRACT

A magnetic shielding material which can decrease the thickness by having excellent conductivity even at low temperatures of, for example, 77 K or lower, in a strong magnetic field of a magnetic flux density of 1 T or more is provide. A magnetic shielding material to be used at low temperatures of 77 K or lower in the magnetic field of a magnetic flux density of 1 T or more, comprises aluminum having a purity of 99.999% by mass or more.

6 Claims, 1 Drawing Sheet

(56) References Cited

U.S. PATENT DOCUMENTS

| | | | |
|---|---|---|---|
| 6,580,346 | B1 | 6/2003 | Takeshima et al. |
| 6,807,812 | B2 | 10/2004 | Lehmann et al. |
| 8,237,440 | B2* | 8/2012 | Balcom et al. ............... 324/318 |
| 2003/0155998 | A1 | 8/2003 | Takeshima et al. |
| 2004/0182089 | A1 | 9/2004 | Lehmann et al. |
| 2009/0260722 | A1 | 10/2009 | Pandey |
| 2009/0270261 | A1 | 10/2009 | Usoskin |
| 2010/0231215 | A1 | 9/2010 | Ma et al. |
| 2012/0273181 | A1* | 11/2012 | Tomaru et al. ............... 165/185 |

FOREIGN PATENT DOCUMENTS

| | | |
|---|---|---|
| JP | S57145957 A | 9/1982 |
| JP | 59-079505 A | 5/1984 |
| JP | 63-293145 A | 11/1988 |
| JP | H0211733 A | 1/1990 |
| JP | 05-144637 A | 6/1993 |
| JP | 05-206529 A | 8/1993 |
| JP | 06-053025 A | 2/1994 |
| JP | 07-015208 | 1/1995 |
| JP | 7-166283 A | 6/1995 |
| JP | 08-335408 A | 12/1996 |
| JP | 09-153408 A | 6/1997 |
| JP | 10-213357 A | 8/1998 |
| JP | 2004-283580 A | 10/2004 |
| JP | 2007-063671 A | 3/2007 |
| JP | 2007-070733 A | 3/2007 |
| JP | 2008-048923 A | 3/2008 |
| JP | 2009-212522 A | 9/2009 |
| JP | 2009-242865 A | 10/2009 |
| JP | 2009-242866 A | 10/2009 |
| JP | 2009-242867 A | 10/2009 |
| JP | 2010-106329 A | 5/2010 |
| JP | 2010-159446 | 7/2010 |
| JP | 2010-232432 A | 10/2010 |
| JP | 2011-195903 A | 10/2011 |
| WO | 2007111150 A1 | 10/2007 |
| WO | 2009063532 A1 | 5/2009 |

OTHER PUBLICATIONS

H. Nomura, et al., "Construction of a solenoid magnet with a new aluminium stabilized superconductor", Cryogenics, Oct. 1971, pp. 396-401.

Search Report issued Aug. 30, 2012 in British Patent Application No. 1207377.1.

Search Report issued Jul. 31, 2012 in British Patent Application No. 1207376.3.

Office Action issued Sep. 22, 2014 in related U.S. Appl. No. 13/458,080 by Tomaru, Takayuki.

Search Report and Written Opinion issued Jul. 25, 2014 in corresponding French Patent Application No. 1253952 with English translation.

A. Maimoni, "Electrical Resistance of Aluminium at Low Temperatures", Cryogenics, Elsevier, Kidlington, GB, vol. 2, No. 4, Jun. 1, 1962, pp. 217-222.

J.R. Purcell and R.B. Jacobs, "Transverse Magnetoresistance of High Purity Aluminium from 4 to 30° K", Cryogenics, Elsevier, Kidlington, GB, vol. 3, No. 2, Jun. 1, 1963, pp. 109-110.

Office Action issued May 22, 2014 in related U.S. Appl. No. 13/458,080 to Takayuki Tomaru.

EPODOC Abstract for JP H02-11733A published Jan. 16, 1990, to Showa Electric Wire & Cable Co., with partial translation.

WPI Abstract Accession No. 82-88895E/42 for JP S57-145957A published Sep. 9, 1982, to Sumitomo Electric Industries, with partial translation.

Office Action dated Jan. 27, 2015, issued in corresponding Japanese Patent Application No. 2011-101774 with English Translation.

Office Action issued Dec. 16, 2014 in related British Patent Application No. GB1207377.1.

Office Action issued Nov. 24, 2014 in related Chinese Patent Application No. 201210129694.X with English translation.

Office Action issued Nov. 26, 2014 in corresponding Chinese Patent Application No. 201210129180.4 with English translation.

Office Action issued Jan. 2, 2015 in the U.S. Patent and Trademark Office in U.S. Appl. No. 13/458,095.

Office Action issued Feb. 27, 2015, in the U.S. Patent and Trademark Office in U.S. Appl. No. 13/458,080.

Search Report and Written Opinion issued Feb. 24, 2015 in corresponding French Patent Application No. 1253958 with English translation.

Notice of Rejection issued Mar. 31, 2015 in corresponding Japanese Patent Application No. 2011-101767 with English translation.

Notice of Rejection dated Mar. 26, 2015 issued in Japanese patent application No. 201-101773 with English translation.

Chinese Office Action date Apr. 3, 2015, issued in application No. 201210129884.1 with English translation.

Wang, Zhutang, "Aluminum Alloy in the Future (II)" with English translation.

* cited by examiner

MAGNETIC SHIELDING MATERIAL FOR SUPERCONDUCTING MAGNET

BACKGROUND OF THE INVENTION

1. Field of the Invention

The present invention relates to a magnetic shielding material for superconducting magnet, which exhibits excellent conductivity at low temperatures of, for example, 77 K or lower, especially cryogenic temperatures of 20 K or lower; and more particularly to a magnetic shielding material which exhibits excellent conductivity even when used in a strong magnetic field of, for example, 1 T or more.

2. Description of the Related Art

A superconducting magnet has been used in various fields, for example, MRIs (magnetic resonance imaging) for diagnosis, NMRs (nuclear magnetic resonance) for analytical use or maglev trains. There have been used, as a superconducting magnet, low-temperature superconducting coils cooled to its boiling point of 4.2 K (Kelvin) using liquid helium, and high-temperature superconducting coils cooled to about 20 K by a refrigerator.

In order to suppress variation in the outside of the magnetic field from exerting an influence on a superconducting magnet, or to suppress the magnetic field generated by a superconducting magnet from exerting an adverse influence on the outside, a magnetic shielding material is usually arranged on the periphery of the superconducting magnet.

Since the magnetic shielding effect can be obtained in a thinner state as electrical resistivity of the magnetic shielding material becomes lower, a material with low resistivity is usually used.

For example, JP H05-144637A discloses that aluminum, copper and alloys thereof can effectively shield variable magnetic field from the outside to decrease AC (alternating-current) loss inside a superconducting coil because of low electrical resistivity thereof.

There has widely been used, as a magnetic shielding material, oxygen-free copper having a purity of 99.99% by mass or more (hereinafter sometimes referred to as "4N" (four nines) and, in the mass percentage notation which indicates a purity, notation is sometimes performed by placing "N" in the rear of the number of "9" which is continuous from the head, for example, purity of 99.9999% by mass or more is sometimes referred to as "6N" (six nines), similarly), which has low electrical resistivity among coppers.

Heretofore, there have been strong demands for miniaturization and weight saving in apparatuses using such a superconducting coil. In order to perform miniaturization and weight saving, it is essential to arrange a magnetic shielding material close to the superconducting coil.

Putting the magnetic shielding material close to the superconducting coil means that the magnetic shielding material is cooled to cryogenic temperatures such as 4.2 K or 20 K as an operating temperature of the superconducting coil, or a boiling point of 77 K of liquid nitrogen or lower, similarly to peripheral materials arranged on the periphery of the superconducting coil. Furthermore, it means the magnetic shielding material is used under the magnetic field from the superconducting coil, namely, it is used in a state where a strong magnetic field of a magnetic flux density of 1 T (Tesla) or more is applied.

Only under the condition of cryogenic temperatures, desired low resistivity can be obtained by using, for example, the above-mentioned copper or aluminum having a purity of 4N class.

However, there is a problem that electrical conductivity is decreased by the magnetoresistance effect in a strong magnetic field of, for example, 1 T or more. It is known that copper has remarkable magnetoresistance effect (namely, electrical resistivity remarkably increases in the magnetic field), and it is also known that aluminum also exhibits large magnetoresistance effect, although not comparable to copper.

A decrease in conductivity caused by the magnetoresistance effect (increase in electrical resistivity) leads to an increase in penetration depth of eddy currents generated by the magnetic field from the outside. Therefore, it is required to increase the thickness of the magnetic shielding material so as to obtain desired magnetic shielding characteristics, resulting in suppression of miniaturization and weight saving of a superconducting apparatus.

SUMMARY OF THE INVENTION

Therefore, an object of the present invention is to provide a magnetic shielding material which can decrease the thickness by having excellent conductivity even at low temperatures of, for example, 77 K or lower, especially cryogenic temperatures of 20 K or lower in a strong magnetic field of a magnetic flux density of 1 T or more.

The present invention provides, in an aspect 1, a magnetic shielding material to be used at low temperature(s) of 77 K or lower (preferably cryogenic temperature(s) of 20 K or lower) in the magnetic field of a magnetic flux density of 1 T or more, including aluminum having a purity of 99.999% by mass or more.

The present inventors have found that even aluminum (Al) can remarkably suppress the magnetoresistance effect by controlling the purity to 99.999% by mass or more. The magnetic shielding material made of such aluminum can obtain excellent electrical conductivity even when used at low temperatures of, for example, 77 K or lower (particularly cryogenic temperatures of 20 K or lower) in a strong magnetic field of a magnetic flux density of 1 T or more.

It becomes possible to decrease a penetration depth of eddy currents due to the magnetic field from the outside, as will be described below for details, by obtaining excellent electrical conductivity (low resistivity) in such way. As a result, the magnetic shielding material according to the present invention can decrease the thickness. Whereby, it becomes possible to achieve miniaturization of various apparatuses using a superconducting apparatus.

The present invention provides, in an aspect 2, the magnetic shielding material according to the aspect 1, wherein the aluminum has the content of iron of 1 ppm by mass or less.

It is possible to ensure conductivity in a strong magnetic field, more surely, by controlling the content of iron to 1 ppm by mass or less, and thus the penetration depth of eddy currents can be decreased.

The present invention provides, in an aspect 3, the magnetic shielding material according to the aspect 1 or 2, wherein the aluminum has a purity of 99.9999% by mass or more.

The present invention provides, in an aspect 4, the magnetic shielding material according to the aspect 1 or 2, wherein the aluminum has a purity of 99.99998% by mass or more.

The present invention provides, in an aspect 5, the magnetic shielding material according to any one of the aspects 1 to 4, wherein the aluminum contains an intermetallic compound $Al_3Fe$.

According to the present invention, it is possible to provide a magnetic shielding material which can decrease the thickness by excellent conductivity even at low temperatures of, for example, 77 K or lower, especially cryogenic temperatures of 20 K or lower in a strong magnetic field of a magnetic flux density of 1 T or more.

DETAILED DESCRIPTION OF THE INVENTION

Figure 1:
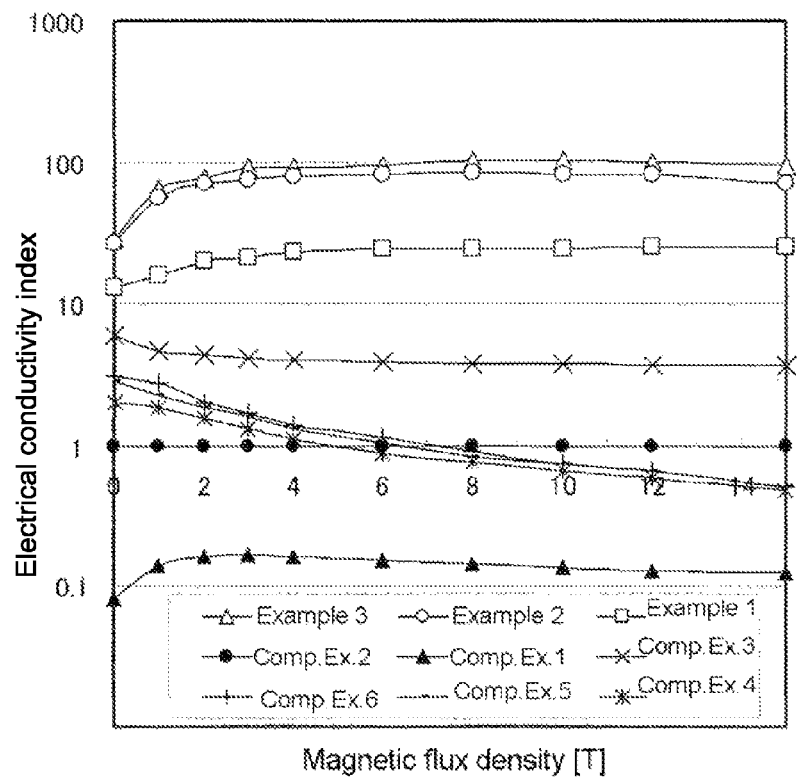
FIG. 1 is a graph showing a relation between the electrical conductivity index and the applied magnetic field (magnetic flux density).

The magnetic shielding material according to the present invention includes aluminum having a purity of 99.999% by mass or more so as to be used even in the magnetic field of a magnetic flux density of 1 T or more.

The present inventors have found, first, that aluminum having a purity of 99.999% by mass or more does not remarkably exert the magnetoresistance effect even when the magnetic field of a magnetic flux density of 1 T or more is applied, and thus conductivity does not decrease. Consequently, the present invention has been completed.

As disclosed, for example, in JP 2009-242865A and JP 2009-242866A, it has been known that electrical resistivity at cryogenic temperatures, for example, liquid helium temperatures decreases as the purity of aluminum increases, like 5N (purity of 99.999% by mass or more) and 6N (purity of 99.9999% by mass or more).

As disclosed, for example, in JP 2010-106329A, aluminum having a purity of 99.999% by mass or more and also having the content of iron of 1 ppm by mass or less has also been known.

It has been known that, although aluminum enables an improvement in electrical conductivity at cryogenic temperatures in a state where the magnetic field is not applied by increasing the purity to about 4N, remarkable magnetoresistance effect is exhibited when a strong magnetic field of a magnetic flux density of 1 T or more is applied, and thus causing a decrease in conductivity. It has been considered that high conductivity cannot be obtained under a strong magnetic field also in high purity aluminum of 5N or 6N purity, similarly to the aluminum of 4N purity.

Therefore, it is considered that aluminum having a purity of 99.999% by mass or more was not used in a magnetic shielding material which is used in the magnetic field of a magnetic flux density of 1 T or more.

It is as mentioned above that the present inventors have found, first, that an increase in resistivity under a strong magnetic field, which has conventionally been conceived, does not occur in high purity aluminum of 5N or higher level.

Although details will be described in the below-mentioned examples, a drastic decrease in conductivity is recognized in a strong magnetic field even in case of a high purity material of 5N or 6N or higher purity, with respect to copper which is commonly used as a magnetic shielding material. Therefore, a phenomenon in which high conductivity is maintained even in a strong magnetic field by achieving high purity of 5N or higher, found by the present inventors, is peculiar to aluminum.

In the magnetic shielding material according to the present invention, the amount of iron contained in aluminum is preferably controlled to 1 ppm by mass or less.

As will be described below for details, the reason is considered as follows: the magnetoresistance effect is more surely suppressed by controlling the amount of iron as a ferromagnetic element, and thus making it possible to surely suppress a decrease in conductivity in a strong magnetic field (caused by the applied strong magnetic field).

The magnetic shielding material according to the present invention remarkably exhibits the effect by using in a state where the magnetic field is applied at low temperatures of 77 K (−196° C.) or lower, more preferably cryogenic temperatures of 20 K (−253° C.) or lower, and also a magnetic flux density of 1 T or more.

Before making a description of details of the magnetic shielding material according to the present invention, a description is made why a magnetic shielding material using a material having excellent electrical conductivity can decrease the thickness.

When variable magnetic field is applied to a conductor (resistor) such as a magnetic shielding material from the outside, the penetration depth of eddy currents generated in the conductor is proportional to d shown in the following equation (1):

$$d=\sqrt{(\rho/f)} \tag{1}$$

where
$\rho$ is a resistivity of a conductor, and f is a frequency of a variable magnetic field.

Although dynamic disturbance factors such as magnetic field variation and vibration due to frequent excitation/degaussing of a superconducting magnet, and other disturbance factors exist, the frequency f is usually within a range from 50 Hz to 500 Hz. Therefore, it is necessary for a magnetic shielding material to have the thickness which is more than the penetration depth of eddy currents when the variable magnetic field at a frequency within the above range is applied.

As is apparent from the equation (1), d is proportional to $\rho^{1/2}$. Namely, it is found that, when other factors are constant, as the resistivity decreases (namely, as the conductivity under an operating environment increases), the thickness of the magnetic shielding material can be decreased.

Details of the magnetic shielding material according to the present invention will be described below.
(1) Level of Impurities As mentioned above, the magnetic shielding material according to the present invention is characterized by being composed of aluminum having a purity of 99.999% by mass or more. The purity is preferably 99.9999% by mass or more, and more preferably 99.99998% by mass or more (hereinafter sometimes referred to as "6N8") for the following reasons. That is, the higher the purity, the less the decrease in electrical conductivity under a strong magnetic field. Furthermore, in case of the purity of 99.9999% by mass or more, the electrical resistivity may sometimes decrease in a strong magnetic field of 1 T or more as compared with the case where the magnetic field is not applied.

The content of iron in aluminum is preferably 1 ppm by mass, and more preferably 0.1 ppm by mass or less.

The reason is that a decrease in conductivity in a strong magnetic field can be suppressed more surely, as mentioned above.

There are still many unclear points in the mechanism in which a decrease in electrical conductivity in a strong magnetic field can be suppressed by controlling the content of iron to 1 ppm by mass or less. However, predictable mechanism at the moment is considered as follows. That is, iron is likely to be influenced by a strong magnetic field since it is a ferromagnetic element and, as a result, when iron exists in the content of more than 1 ppm by mass, an influence exerted on the conductivity increases, and thus the conductivity under a strong magnetic field may decrease. When the content of iron is 0.1 ppm, an influence due to the ferromagnetic material can be excluded almost completely. However, this predictable mechanism does not restrict the scope of the present invention.

Ni and Co are known as ferromagnetic elements other than iron. However, since these elements are easily removed in a known process for highly purification of aluminum, the numerical value of the content is out of the question. However, the contents of these Ni and Co are also preferably 1 ppm or less, and more preferably 0.1 ppm or less.

The purity of aluminum can be defined in some methods. For example, it may be determined by the measurement of the content of aluminum. However, it is preferred that the purity of aluminum is determined by measuring the content (% by mass) of the following 33 elements contained as impurities in aluminum and subtracting the total of these contents from 100%, so as to determine the purity of aluminum with high accuracy in a comparatively simple manner.

Herein, 33 elements contained as impurities are lithium (Li), beryllium (Be), boron (B), sodium (Na), magnesium (Mg), silicon (Si), potassium (K), calcium (Ca), titanium (Ti), vanadium (V), chromium (Cr), manganese (Mn), iron (Fe), nickel (Ni), cobalt (Co), copper (Cu), zinc (Zn), gallium (Ga), arsenic (As), zirconium (Zr), molybdenum (Mo), silver (Ag), cadmium (Cd), indium (In), tin (Sn), antimony (Sb), barium (Ba), lantern (La), cerium (Ce), platinum (Pt), mercury (Hg), lead (Pb) and bismuth (Bi).

The contents of these elements can be determined, for example, by glow discharge mass spectrometry.

(2) Purification Method

Such high purity aluminum may be obtained by using any purification (refinement) method. Some purification methods for obtaining high purity aluminum according to the present invention are exemplified below. However, the purification method is not limited to these methods as a matter of course.

Three-Layer Electrolysis Process

It is possible to use, as one of methods of obtaining high purity aluminum, a three-layer electrolysis process in which commercially available aluminum having comparatively low purity (for example with special grade 1 of 99.9% purity as specified in JIS-H2102) is charged in an Al—Cu alloy layer and is used as an anode in a molten state, and an electrolytic bath containing aluminum fluoride and barium fluoride therein is arranged thereon, and thus high purity aluminum is produced on a cathode.

In the three-layer electrolysis process, aluminum having a purity of 99.999% by mass or more can be mainly obtained. It is possible to suppress the content of iron in aluminum to 1 ppm by mass or less, comparatively easily.

Unidirectional Solidification Process

For example, a unidirectional solidification process can be used so as to further increase a purity of the high purity aluminum obtained by a three-layer electrolysis process.

The content of Fe and the respective contents of Ti, V, Cr and Zr can be selectively decreased by the unidirectional solidification process.

It has been known that the unidirectional solidification process is, for example, a method in which aluminum is melted in a furnace tube using a furnace body moving type tubular furnace and then unidirectionally solidified from one end by pulling out a furnace body from a furnace tube, and that the contents of the respective elements of Ti, V, Cr and Zr are selectively increased at the side of the solidification initiation end, and also the content of Fe is selectively increased at the side of the solidification completion end (opposite side of the solidification initiation end). Therefore, it becomes possible to surely decrease the contents of the respective elements of Fe, and Ti, V, Cr and Zr by cutting off the both sides of the solidification initiation end and the solidification completion end of the obtained ingot. It may be determined, which specific portion of the ingot obtained by the unidirectional solidification process must be cut, by analyzing the contents of elements at appropriate intervals along a solidification direction so that only portion, where the total content of the contents of Fe, and Ti, V, Cr and Zr is sufficiently decreased, is allowed to remain.

There is no particular limitation on the order of implementation of purification by the three-layer electrolysis process and purification by the unidirectional solidification process. Usually, purification is implemented by the three-layer electrolysis process, and then purification is implemented by the unidirectional solidification process. Purification by the three-layer electrolysis process and purification by the unidirectional solidification process may be implemented, for example, alternately and repeatedly, or any one of or both purifications may be repeatedly implemented, respectively. It is particularly preferred that purification by the unidirectional solidification process is repeatedly implemented.

In such way, aluminum having a purity of 99.9999% by mass or more can be obtained by using the three-layer electrolysis process in combination with the unidirectional solidification process. It is also possible to suppress the content of iron in aluminum to 1 ppm by mass or less, and more preferably 0.1 ppm by mass or less in a comparatively easy manner.

Zone Melting Process

Furthermore, a zone melting process can be used so as to obtain aluminum having high purity, for example, a purity of 99.99998% by mass or more. When the zone melting process is appropriately used, the content of iron in aluminum can be suppressed to 1 ppm by mass or less, and more preferably 0.1 ppm by mass or less, more surely.

In particular, it is effective to use a purification method of aluminum through the zone melting process invented by the present inventors (method described in Japanese Patent Application No. 2010-064544. The disclosure of Japanese Patent Application No. 2010-064544 is incorporated by reference herein).

In order to prevent impurities from diffusing into heated aluminum when removing impurities in aluminum by zone melting purification process, it is preferred that an alumina layer is formed in advance on a surface of a boat in which aluminum is placed, and also zone melting purification is performed in vacuum under a pressure of $3\times10^{-5}$ Pa or less, and more preferably from $3\times10^{-6}$ Pa to $2\times10^{-6}$ Pa, so as to surely separate impurities from molten aluminum.

It is preferred to carry out a pretreatment, in which a surface layer of an aluminum raw material to be subjected to zone melting purification is dissolved and removed in advance, before zone melting purification is performed. There is no particular limitation of the pretreatment method, and various treatments used in the relevant technical field can be used so as to remove the surface layer of the aluminum raw material.

Examples of the pretreatment include an acid treatment, an electrolytic polishing treatment and the like.

The above-mentioned boat to be used in the zone melting purification process is preferably a graphite boat, and is preferably baked in an inert gas or vacuum in advance after formation of the above-mentioned alumina layer.

The width of the melting section where aluminum is melted during the zone melting purification is preferably adjusted to w×1.5 or more and w×6 or less based on a cross sectional dimension w of the aluminum raw material.

An aluminum raw material to be used in the purification is obtained by using the three-layer electrolysis process in combination with the unidirectional solidification process and, for example, high purity aluminum having a purity of 99.9999% by mass or more is preferably used.

In case of zone melting, for example, the melting section is moved from one end of a raw aluminum toward the other end by moving a high frequency coil for high frequency heating, and thus the entire raw aluminum can be subjected to zone melting purification. Among impurity metal element components, peritectic components (Ti, V, Cr, As, Se, Zr and Mo) tend to be concentrated to the melting initiation section and eutectic components (26 elements as a result of removal of peritectic 7 elements from the above-mentioned 33 impurity elements) tend to be concentrated to the melting completion section, and thus a high purity aluminum can be obtained in the region where both ends of the aluminum raw material are removed.

After moving the melting section within a predetermined distance, like a distance from one end to the other end in a longitudinal direction of an aluminum raw material, high frequency heating is completed and the melting section is solidified. After the solidification, an aluminum material is cut out (for example, both ends are cut off) to obtain a purified high purity aluminum material.

When a plurality of aluminum raw materials are arranged in a longitudinal direction (in a movement direction of the melting section), it is preferred that the aluminum raw materials in a longitudinal direction are brought into contact with each other to treat as one aluminum raw material in a longitudinal direction, and then the melting section is moved from one end (i.e., one of two ends where adjacent aluminum raw materials are not present in a longitudinal direction among ends of the plurality of aluminum raw materials) to the other end (i.e., the other one of two ends where adjacent aluminum raw materials are not present in a longitudinal direction among ends of the plurality of aluminum raw materials).

The reason is that ends of the aluminum raw material contacted with each other are united during zone melting, and thus a long aluminum material can be obtained.

As mentioned above, after zone melting (zone melting purification) from one end to the other end of the aluminum raw material, zone melting can be repeated again from one end to the other end. The number of repeat times (number of passes) is usually 1 or more and 20 or less. Even if the number of passes is more than the above range, an improvement in the purification effect is restrictive.

In order to effectively remove the peritectic 7 elements, the number of passes is preferably 3 or more, and more preferably 5 or more. When the number of passes is less than the above range, peritectic 7 elements are less likely to moved, and thus sufficient purification effect may not be obtained.

The reason is as follows. When a plurality of aluminum raw materials are arranged in contact with each other in a longitudinal direction, when the number of passes is less than 3, a shape (especially, height size) of the purified aluminum after uniting becomes un-uniform, and thus the melting width may sometimes vary during purification and uniform purification is less likely to be obtained.

(3) Forming Method

The ingot of the high purity aluminum obtained by the above-mentioned purification method is formed into a desired shape using various methods.

The forming method will be shown below. However, the forming method is not limited thereto.

Rolling

When a magnetic shielding material to be obtained is a plate or a wire, rolling is an effective forming method.

The rolling may be performed using a conventional method, for example, a method in which an ingot is passed through a pair of rolls by interposing into the space between these rolls while applying a pressure. There is no particular limitation on specific techniques and conditions (temperature of materials and rolls, treatment time, reduction ratio, etc.) in case of rolling, and these concrete techniques and conditions may be appropriately set unless the effects of the present invention are impaired.

There is no particular limitation on the size of the plate and wire to be finally obtained by rolling. As for preferable size, the thickness is from 0.1 mm to 3 mm in case of the plate, or the diameter is from 0.1 mm to 3 mm in case of the wire.

When the thickness is less than 0.1 mm, sufficient conduction characteristics required as the magnetic shielding material may be sometimes less likely to be obtained since a cross section decreases. In contrast, when the thickness is more than 3 mm, it may sometimes become difficult to deform utilizing flexibility. When the thickness is from 0.1 mm to 3 mm, there is an advantage such as easy handling, for example, the material can be arranged on a side surface of a curved container utilizing flexibility.

As a matter of course, the shape obtainable by rolling is not limited to the plate or wire and, for example, a pipe shape and an H-shape can be obtained by rolling.

The rolling may be hot rolling or warm rolling in which an ingot is heated in advance and then rolling is performed in a state of being set at a temperature higher than room temperature, or may be cold rolling in which the ingot is not heated in advance. Alternatively, hot rolling or warm rolling may be used in combination with cold rolling.

In case of rolling, it is also possible to be cast or cut the material into a desired shape in advance. In case of casting, for example, a conventional method may be employed, but is not limited to, for example, a method in which high purity aluminum is heated and melted to form a molten metal and the obtained high purity aluminum molten metal is solidified by cooling in a mold. Also, there is no particular limitation on the conditions or the like in case of casting. The heating temperature is usually from 700 to 800° C., and heating and melting is usually performed in vacuum or an inert gas (nitrogen gas, argon gas, etc.) atmosphere in a crucible made of graphite.

Forming Method Other than Rolling

Wire drawing or extrusion may be performed as a forming method other than rolling. There is no limitation on the shape obtained by drawing or extrusion. For example, drawing or extrusion is suited to obtain a wire having a circular cross section.

A desired wire shape may be obtained by rolling before drawing to obtain a rolled wire (rolled wire rod) and then drawing the rolled wire.

The cross section of the obtained wire is not limited to a circle and the wire may have a noncircular cross section, for example, an oval or square cross section.

The desired shape may also be obtained by cutting the ingot, except for drawing or extrusion.

(4) Annealing

Furthermore, the molded article of the present invention obtained by the above forming method such as rolling may be optionally subjected to an annealing treatment. It is possible to remove strain, which may be usually sometimes generated in case of cutting out a material to be formed from the ingot, or forming, by subjecting to an annealing treatment.

There is no particular limitation on the conditions of the annealing treatment, and a method of maintaining at 400 to 600° C. for one or more hours is preferable.

When the temperature is lower than 400° C., strain (dislocation) included in the ingot is not sufficiently decreased for the following reason. Since strain (dislocation) serves as a factor for enhancing electrical resistivity, excellent conduction characteristics may not be sometimes exhibited. When the heat treatment temperature is higher than 600° C., solution of impurities in solid, especially solution of iron into a matrix proceeds. Since solid-soluted iron has large effect of enhancing electrical resistivity, conduction characteristics may sometimes deteriorate.

More preferably, the temperature is maintained at 430 to 550° C. for one or more hours for the following reason.

When the temperature is within the above range, strain can be sufficiently removed and also iron exists as an intermetallic compound with aluminum without being solid-soluted into the matrix.

The following reasons are also exemplified.

As an intermetallic compound of iron and aluminum, for example, a plurality of kinds such as $Al_6Fe$, $Al_3Fe$ and $Al_mFe$ (m≈4.5) are known. It is considered that the majority of (for example, 50% or more, and preferably 70% or more in terms of volume ratio) of an intermetallic compound of iron and aluminum, which exists in a high purity aluminum material obtained after annealing within a temperature range (430 to 550° C.), is $Al_3Fe$.

Existence of $Al_3Fe$ and the volume ratio thereof can be confirmed and measured by dissolution of a matrix (base material) using a chemical solvent, and collection by filtration, followed by observation of the residue collected by filtration using an analytical electron microscope (analytical TEM) and further analysis.

This $Al_3Fe$ has such an advantage that it scarcely exerts an adverse influence on the conductivity even in case of existing as a precipitate.

The magnetic shielding material according to the present invention may be composed only of the above-mentioned high purity aluminum having a purity of 99.999% by mass or more and may contain the portion other than the high purity aluminum, for example, protective coating so as to impart various functions.

EXAMPLES

Example 1 (purity of 99.999% by mass or more, 5N-Al), Example 2 (purity of 99.9999% by mass or more, 6N-Al) and Example 3 (purity of 99.99998% by mass or more, 6N8-Al), details of which are shown below, were produced as example samples, and then resistivity (specific electrical resistivity) was measured.

Comparative Example 1 (4N-Al) as aluminum having a purity of 4N level, and Comparative Example 2 (3N-Al) as aluminum having a purity of 3N level are shown below as Comparative Examples. The resistivity of Comparative Examples 1 and 2 was determined by calculation.

For comparison with copper, a sample of copper having a purity of 5N level was prepared and then the resistivity was measured as Comparative Example 3.

As for copper, literature data were used as Comparative Example. Comparative Example 4 is copper sample having a purity of 4N level, Comparative Example 5 is copper sample having a purity of 5N level, and Comparative Example 6 is copper sample having a purity of 6N level.

(1) Production of High Purity Aluminum

First, the method for producing a high purity aluminum used in Examples 1 to 3 is shown below.

Example 1

A commercially available aluminum having a purity of 99.92% by mass was purified by the three-layer electrolysis process to obtain a high purity aluminum having a purity of 99.999% by mass or more.

Specifically, a commercially available aluminum (99.92% by mass) was charged in an Al—Cu alloy layer and the composition of an electrolytic bath was adjusted to 41% $AlF_3$-35% $BaF_2$-14% $CaF_2$-10% NaF. Electricity was supplied at 760° C. and a high purity aluminum deposited at a cathode side was collected.

The contents of the respective elements in this high purity aluminum were analyzed by glow discharge mass spectrometry (using "VG9000", manufactured by THERMO ELECTRON Co., Ltd) to obtain the results shown in Table 1.

Example 2

The high purity aluminum obtained by the above-mentioned three-layer electrolysis process was purified by the unidirectional solidification to obtain a high purity aluminum having a purity of 99.9999% by mass or more.

Specifically, 2 kg of the high purity aluminum obtained by the three-layer electrolysis process was placed in a crucible (inside dimension: 65 mm in with×400 mm in length×35 mm in height) and the crucible was accommodated inside a furnace tube (made of quartz, 100 mm in inside diameter×1,000 mm in length) of a furnace body transfer type tubular furnace. The high purity aluminum was melted by controlling a furnace body (crucible) to 700° C. in a vacuum atmosphere of $1×10^{-2}$ Pa, and then unidirectionally solidified from the end by pulling out the furnace body from the furnace tube at a speed of 30 mm/hour. After cutting out from the position which is 50 mm from the solidification initiation end in a length direction to the position which is 150 mm from the solidification initiation end, a massive high purity aluminum measuring 65 mm in width×100 mm in length×30 mm in thickness was obtained.

The contents of the respective elements in this high purity aluminum were analyzed by glow discharge mass spectrometry in the same manner as described above to obtain the results as shown in Table 1.

Example 3

After cutting into a quadrangular prism measuring about 18 mm×18 mm×100 mm or a similar shape from the 6N aluminum ingot obtained by the above-mentioned unidirectional solidification process, and further acid pickling with an aqueous 20% hydrochloric acid solution prepared by diluting with pure water for 3 hours, an aluminum raw material was obtained.

Using this aluminum raw material, a zone melting process was carried out by the following method.

A graphite boat was placed inside a vacuum chamber (a quartz tube measuring 50 mm in outside diameter, 46 mm in inside diameter, 1,400 mm in length) of a zone melting purification apparatus. A high purity alumina powder AKP Series (purity: 99.99%) manufactured by Sumitomo Chemical Company, Limited was applied to the portion, where the raw material is placed, of the graphite boat while pressing to form an alumina layer.

The graphite boat was baked by high frequency heating under vacuum.

The baking was carried out by heating in vacuum of $10^{-5}$ to $10^{-7}$ Pa using a high frequency heating coil (heating coil winding number: 3, 70 mm in inside diameter, frequency of about 100 kHz) used in zone melting, and moving from one end to the other end of the boat at a speed of 100 mm/hour thereby sequentially heating the entire graphite boat.

The above-mentioned 9 aluminum raw materials in total weight of about 780 g were arranged on the portion (measuring 20×20×1,000 mm), where the raw materials are placed, provided in the graphite boat. The aluminum raw materials were arranged in the form of a quadrangular prism consisting of 9 raw materials (cross sectional dimension w of aluminum raw materials=18 mm, length L=900 mm, L=w×50).

After sealing inside a chamber, evacuation was carried out by a turbo-molecular pump and an oil sealed rotary pump until the pressure reaches 1×10$^{-5}$ Pa or less. Then, one end of the aluminum raw material in a longitudinal direction was heated and melted using a high frequency heating coil (high frequency coil) to form a melting section.

The output of the high frequency power source (frequency: 100 kHz, maximum output: 5 kW) was adjusted so that the melting width of the melting section becomes about 70 mm. Then, the high frequency coil was moved at a speed of 100 mm per hour thereby moving the melting section by about 900 mm. At this time, the pressure in the chamber was from 5×10$^{-6}$ to 9×10$^{-6}$ Pa. The temperature of the melting section was measured by a radiation thermometer. As a result, it was from 660° C. to 800° C.

Then, high frequency output was gradually decreased thereby solidifying the melting section.

The high frequency coil was moved to the melting initiation position (position where the melting section was formed first) and the aluminum raw material was heated and melted again at the melting initiation position while maintaining vacuum inside the chamber to form a melting section. Zone melting purification was repeated by moving this melting section. At the moment when zone melting purification was carried out three times (3 passes) in total at a melting width of about 70 mm and a traveling speed of 100 mm/hour of the melting section, the shape from the melting initiation section to the completion section became almost uniform, and uniform shape was maintained from then on (during 7 passes mentioned below).

Then, zone melting purification was carried out 7 passes at a melting width of about 50 mm and a traveling speed of 60 mm/hour of the melting section. The melting width was from w×2.8 to w×3.9 based on a cross sectional size w of the aluminum raw material to be purified.

After completion of 10 passes in total, the chamber was opened to atmospheric air and then aluminum was removed to obtain a purified aluminum of about 950 mm in length.

The obtained aluminum was cut out and glow discharge mass spectrometry component analysis was carried out in the same manner as described above. The results are shown in Table 1.

TABLE 1

| | Comparative Example 1 | Comparative Example 2 | Example 1 | Example 2 | Example 3 |
|---|---|---|---|---|---|
| Li | 0.016 | | <0.001 | <0.001 | <0.001 |
| Be | 0.042 | | <0.001 | <0.001 | <0.001 |
| B | 1.5 | 2.8 | 0.019 | 0.007 | 0.001 |
| Na | 1.4 | | 0.012 | 0.001 | 0.001 |
| Mg | 5.2 | 0.1 | 0.48 | 0.10 | 0.001 |
| Si | 200 | 25 | 2.3 | 0.34 | 0.003 |
| K | <0.001 | | 0.013 | 0.008 | 0.008 |
| Ca | 1.3 | | 0.002 | 0.002 | 0.003 |
| Ti | 29 | 0.7 | 0.060 | 0.027 | 0.031 |
| V | 53 | 2.2 | 0.023 | 0.027 | 0.023 |
| Cr | 3.9 | 2.1 | 0.025 | 0.026 | 0.022 |
| Mn | 2.1 | 2.1 | 0.007 | 0.004 | 0.006 |
| Fe | 230 | 12 | 0.60 | 0.089 | 0.001 |
| Ni | 0.19 | | 0.018 | 0.004 | 0.001 |
| Co | 13 | 0.3 | <0.001 | <0.001 | <0.001 |
| Cu | 0.72 | 1 | 1.1 | 0.14 | 0.016 |
| Zn | 13 | 7 | 0.22 | 0.002 | 0.001 |
| Ga | 93 | 12 | 0.006 | 0.001 | 0.001 |
| As | 0.023 | | 0.029 | 0.001 | 0.001 |
| Zr | 4.8 | | 0.023 | 0.030 | 0.036 |
| Mo | 0.35 | | <0.001 | <0.003 | <0.004 |
| Ag | 1.1 | | <0.001 | <0.001 | <0.001 |
| Cd | <0.001 | | 0.002 | 0.002 | 0.002 |
| In | 0.009 | | <0.001 | <0.001 | <0.001 |
| Sn | 1.1 | | 0.001 | 0.001 | 0.002 |
| Sb | <0.001 | | <0.001 | <0.001 | <0.001 |
| Ba | 0.004 | | <0.001 | <0.001 | <0.001 |
| La | 0.038 | | 0.045 | 0.001 | 0.001 |
| Ce | 0.095 | | 0.17 | 0.001 | 0.001 |
| Pt | <0.001 | | 0.002 | 0.001 | 0.001 |
| Hg | <0.001 | | 0.001 | 0.003 | 0.002 |
| Pb | 1.9 | | 0.004 | 0.001 | 0.001 |
| Bi | <0.001 | | 0.001 | 0.001 | 0.001 |
| Total | 669 | 67 | <5.4 | <8.3 | <0.18 |

Unit: ppm by mass

Then, the thus obtained high purity aluminum of Examples 1 to 3 were respectively cut to obtain materials for wire drawing each measuring 6 mm in width×6 mm in thickness× 100 mm in length. In order to remove contamination elements due to cutting of a surface of the material for wire drawing, acid pickling was performed using an acid prepared at a ratio (hydrochloric acid:pure water=1:1) for 1 hour, followed by washed with running water for more than 30 minutes.

The obtained material for wire drawing was drawn to a diameter to 0.5 mm by rolling using grooved rolls and wire drawing. The specimen obtained by wire drawing was fixed to a quartz jig, maintained in vacuum at 500° C. for 3 hours and then furnace-cooled to obtain a sample for the measurement of resistivity.

Furthermore, a commercially available high purity copper having a purity of 5N level (manufactured by NewMet Koch, 99.999% Cu, 0.5 mm in diameter) as the sample of Comparative Example 3 was fixed to a quartz jig, washed with an organic solvent, maintained in vacuum at 500° C. for 3 hours and then furnace-cooled to obtain a sample for the measurement of resistivity.

(2) Derivation of Resistivity

Measurement of Resistivity

With respect to the samples of Examples 1 to 3 and Comparative Example 3, the resistivity was actually measured.

After immersing the obtained sample in liquid helium (4.2 K), the resistivity was measured by varying the magnetic field to be applied to the sample from a magnetic flux density 0 T (magnetic field was not applied) to 15 T, using the four-wire method.

The magnetic field was applied in a direction parallel to a longitudinal direction of the sample.

Calculation of Resistivity

With respect to Comparative Example 1 and Comparative Example 2 with the composition shown in Table 1, calculation was performed using the following equation (4) described in the literature: R. J. Corruccini, NBS Technical Note, 218 (1964). In the equation (4), $\Delta\rho_H$ is an amount of an increase in resistivity in the magnetic field. $\rho_{RT}$ is resistivity at room temperature when the magnetic field is not applied, and was set to 2,753 nΩcm since it can be treated as a nearly given value in high purity aluminum having a purity of 3N or more. ρ is resistivity at 4.2 K when the magnetic field is not applied and largely varied depending on the purity. Therefore, the following experimental values were used: 9.42 nΩcm (RRR=285) in 4N-Al and 117 nΩcm (RRR=23) in 3N-Al. These equations are obtained when the magnetic field is perpendicular to a longitudinal direction of the sample. However, since similar equations when the magnetic field is parallel to a longitudinal direction of the sample are not obtained, these equations were used for comparison this time. RRR is also called a residual resistivity ratio and is a ratio of resistivity at 297 K to resistivity at a helium temperature (4.2 K).

$$\frac{\Delta\rho_H}{\rho} = \frac{H_*^2(1 + 0.00177H_*)}{(1.8 + 1.6H_* + 0.53H_*^2)} \quad (4)$$

where
$H^* = H/100 \, \rho_{RT}/\rho_R$
H=Intensity of applied magnetic field (Tesla)
$\rho_{RT}$=Resistivity at room temperature when magnetic field is not applied
ρ=Resistivity when magnetic field is not applied
Citation from Literatures Relating to Resistivity With respect to Comparative Examples 4 to 6, the resistivity was obtained from the literature: Fujiwara S. et. al., Int. Conf. Process. Mater. Prop., 1st (1993), 909-912. In these literature data, a relation between the application direction of the magnetic field and the longitudinal direction of the same is not described.

The thus derived value of resistivity of Examples 1 to 3 and Comparative Examples 1 to 6 are shown in Table 2.

With respect to RRR, Examples 1 to 3 and Comparative Examples 1 to 3 are measured values, and Comparative Examples 4 to 6 are literature data.

increases as the intensity of the magnetic field (magnetic flux density) increases as compared with the case where the magnetic field is absent (0 T), and the resistivity increases by about 3 times at 15 T.

To the contrary, in Examples 1 to 3, the resistivity is small such as a tenth or less as compared with Comparative Example 2 in a state where the magnetic field is absent, and also the resistivity only slightly increases even if the magnetic field increases.

In Example 1 (5N level), the resistivity at 15 T slightly increases (about 1.5 times) as compared with the case where the magnetic field is absent, and it is apparent that the increase of the resistivity caused by magnetic field is small compared with Comparative Example 2.

In Example 2 (6N level), the resistivity slightly increases (within 100) even at 15 T as compared with the case where the magnetic field is absent. When the magnetic flux density is within a range from 1 to 12 T, the value of the resistivity decreased as compared with the case where the magnetic field is not applied, and thus remarkable magnetoresistance suppression effect is exhibited.

As for Example 3 (6N8 level), the resistivity decreases as compared with the case where the magnetic field is absent even at any magnetic flux density of 1 to 15 T, and thus remarkable magnetoresistance suppression effect is exhibited.

FIG. 1 is a graph showing a relation between the electrical conductivity index and the applied magnetic field (magnetic flux density). The electrical conductivity index is an index which indicates the magnitude of the electrical conductivity of the respective samples based on Comparative Example 2 which exhibits the resistivity in a strong magnetic field of aluminum having a purity of 4N. Namely, in each magnetic flux density the electrical conductivity index is determined by dividing the value of the resistivity of Comparative Example 2 with the value of the resistivity of each sample. The larger the value of this index, the superior the conductive properties under the magnetic flux density (strong magnetic field) is as compared with the sample of Comparative Example 2.

The electrical conductivity index of the ordinate was indicated by logarithm since samples of Examples exhibit extremely remarkable effect.

TABLE 2

| | RRR | Resistivity ρ (nΩcm) | | | | | | | | | |
|---|---|---|---|---|---|---|---|---|---|---|---|
| | $\rho_{297K}/\rho_{4K}$ | 0 T | 1 T | 2 T | 3 T | 4 T | 6 T | 8 T | 10 T | 12 T | 15 T |
| Example 3 | 8,060 | 0.333 | 0.260 | 0.261 | 0.246 | 0.253 | 0.260 | 0.249 | 0.254 | 0.268 | 0.286 |
| Example 2 | 7,610 | 0.353 | 0.294 | 0.292 | 0.298 | 0.297 | 0.303 | 0.307 | 0.318 | 0.328 | 0.384 |
| Example 1 | 3,740 | 0.72 | 1.04 | 1.02 | 1.05 | 1.02 | 1.02 | 1.06 | 1.06 | 1.05 | 1.06 |
| Comparative Example 2 | 285 | 9.42 | 16.8 | 20.5 | 22.4 | 23.6 | 24.9 | 25.7 | 26.3 | 26.8 | 27.3 |
| Comparative Example 1 | 23 | 117 | 120 | 127 | 135 | 144 | 163 | 179 | 194 | 206 | 221 |
| Comparative Example 3 | 957 | 1.57 | 3.58 | 4.73 | 5.4 | 5.8 | 6.4 | 6.7 | 7.0 | 7.2 | 7.4 |
| Comparative Example 6 | 500 | 3 | 6.1 | 10 | 13 | 17 | 22 | 28 | 35 | 41 | 53 |
| Comparative Example 5 | 455 | 3.3 | 7.3 | 11 | 14 | 18 | 24 | 30.5 | 35 | 41 | 53 |
| Comparative Example 4 | 326 | 4.6 | 9 | 13 | 17 | 21 | 28 | 34 | 40 | 46 | 56.5 |

As is apparent from Table 2, in the sample of Comparative Example 2 corresponding to a magnetic shielding material made of a conventional aluminum (4N level), the resistivity As is apparent from FIG. 1, samples of Examples show the conductivity is about 13 to 28 times higher than that of Comparative Example 2 even in the case where the magnetic field is absent. As the magnetic field is applied, the conductivity increases as compared with Comparative Example 2. The conductivity is 16 times (Example 1) to 65 times (Example 3) higher at 1 T, and the conductivity further increases since it is 26 times (Example 1) to 96 times (Example 1) higher at 15 T.

As is apparent from FIG. 1, any of copper samples (Comparative Examples 3 to 6) shows a right downward curve and, as the intensity of the magnetic field increases, the magnetoresistance effect increases as compared with Comparative Example 2. Namely, it is found that, in case of copper, a decrease in conductivity due to magnetoresistance cannot be suppressed even if the purity is increased to 6N level (as is apparent from Table 1, in samples of Comparative Examples 3 to 6, the resistivity at 15 T increases by 5 to 18 times as compared with the resistivity in case where the magnetic field is absent), and that the effect capable of suppressing a decrease in conductivity in the magnetic field by increasing the purity to 99.999% by mass or more, found by the present inventors, is peculiar to aluminum.

The reason why, the magnetoresistance suppression effect by highly purification is not exhibited in copper but is exhibited in aluminum, is unclear. However, it is deduced that it is caused by a difference in electrical resistivity factor. Namely, it is considered that a main electrical resistivity of the high purity copper is the scattering of conduction electrons due to grain boundaries or dislocations, and the electrical resistivity factor slightly varies even by highly purification, and thus magnetoresistance also slightly varies. On the other hand, an electrical resistivity factor of the high purity aluminum is the scattering of conduction electrons by impurity atoms, and the electrical resistivity factor is decreased by highly purification. Therefore, it is considered that excellent characteristics such as little increase in electrical resistivity in the magnetic field may be exhibited in aluminum having a purity of 5N or more. However, this predictable mechanism does not restrict the technical scope of the present invention.

Figure 2:
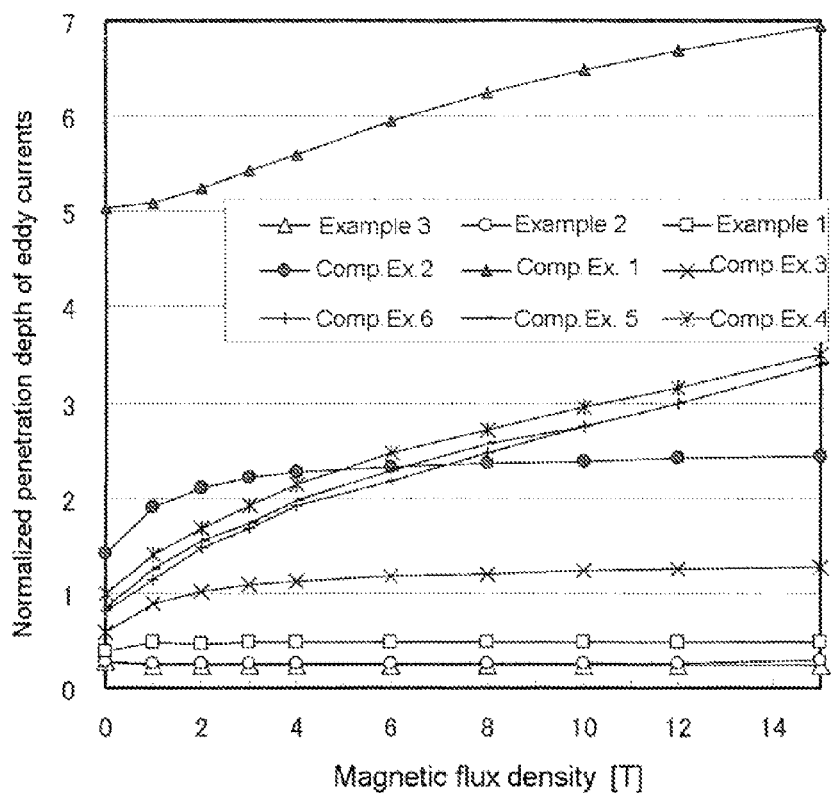
FIG. 2 is a graph showing a relation between the eddy current penetration depth and the applied magnetic field (magnetic flux density).

Next, using the results of Table 2, the penetration depth of eddy current in case of using samples of Examples 1 to 3 and Comparative Examples 1 to 6 was determined. FIG. 2 is a graph showing a relation between the eddy current penetration depth and the applied magnetic field (magnetic flux density). The eddy current penetration depth was determined by using the above-mentioned equation (1) and by regarding the value of relative magnetic permeability of copper and aluminum as 1. The obtained values were normalized with the eddy current penetration depth under of Comparative Example 4 which corresponds to copper having a purity of 4N level and which is now widely used as a magnetic shielding material, in the condition that magnetic field is not applied (0 T). These normalized values are shown in FIG. 2 as normalized eddy current penetration depths. Namely, the eddy current penetration depth indicates how many times eddy currents penetrate as compared with the case of 0 T of Comparative Example 4.

In Example 1, the penetration depth (the normalized value, the same shall apply hereinafter) is 0.4 at 0 T and, when the intensity of the magnetic field (magnetic flux density) is between 1 T and 15 T, the penetration depth is almost constant (0.47 to 0.48) and the penetration depth remarkably is small as compared with Comparative Example 4.

In Example 2, when the magnetic field is between 0 T to 15 T, the penetration depth is stable at low value (0.25 to 0.29), and the penetration depth is more remarkably small.

In Example 3, when the magnetic field is between 0 T to 15 T, the penetration depth is stable at low value (0.23 to 0.27) as compared with Example 2, and the penetration depth is farther remarkably small.

In contrast, in Comparative Example 2 in which the material is aluminum having a purity of 4N, the penetration depth already exceeds 1 at 0 T and increases to 2.44 with an increase in the magnetic field. Similarly, in Comparative Example 1 in which the material is aluminum having a purity of 3N, the penetration depth exceed 5 even at 0 T and reaches 6.94 at 15 T.

With respect to copper, in any of samples of Comparative Examples 3 to 6, the penetration depth increases as the intensity of the magnetic field increases, and also a difference in tendency of an increase due to the purity is not recognized so much. For example, in Comparative Example 3, the penetration depth is 0.58 at 0 T and increases to about 1.27 at 15 T, i.e. increased by 2.2 times. In Comparative Example 4, the penetration depth is 1 at 0 T and increases by 3.5 times (3.50) at 15 T. In Comparative Example 5, the penetration depth is 0.85 at 0 T and increases by 4.0 times (3.39) at 15 T. In Comparative Example 6, the penetration depth is 0.81 at 0 T and increases by 4.2 times (3.39) at 15 T.

According to the present invention, it is possible to provide a magnetic shielding material which can decrease the thickness by high conductivity even at low temperatures such as a liquid nitrogen temperature (77 K) or lower in a strong magnetic field of a magnetic flux density of 1 T or more.

The present application claims priority based on Japanese Patent Application No. 2011-101773. The disclosure of Japanese Patent Application No. 2011-101773 is incorporated by reference herein.

What is claimed is:

1. A method of shielding a superconducting magnet comprising:
    placing a magnetic shielding material on a periphery of the superconducting magnet,
    wherein the magnetic shielding material includes aluminum having a purity of 99.999% by mass or more,
    the superconducting magnet being operated at low temperatures of 77 K or lower in the magnetic field of a magnetic flux density of 1 T or more, such that the magnetic shielding material is subjected to the magnetic field and the low temperatures.

2. The method of shielding the superconducting magnet according to claim 1, wherein the aluminum has the content of iron of 1 ppm by mass or less.

3. The method of shielding the superconducting magnet according to claim 1, wherein the aluminum has a purity of 99.9999% by mass or more.

4. The method of shielding the superconducting magnet according to claim 1, wherein the aluminum has a purity of 99.99998% by mass or more.

5. The method of shielding the superconducting magnet according to claim 1, wherein the aluminum comprises an intermetallic compound $Al_3Fe$.

6. The method of shielding the superconducting magnet according to claim 1, wherein the magnetic shielding material has a resistivity ranging from 0.246 to 1.06 nΩcm when measured in liquid helium at 4.2 K by varying a magnetic field applied to the magnetic shielding material from a magnetic flux density of 0 T to 15 T.

* * * * *